USOO5213988A

United States Patent [19]

Yamauchi et al.

[11] Patent Number: 5,213,988
[45] Date of Patent: May 25, 1993

[54] METHOD OF MANUFACTURING BIPOLAR TRANSISTOR WITH SELF-ALIGNED BASE REGIONS

[75] Inventors: Tomohiro Yamauchi, Kawasaki; Yasunobu Kodaira, Tokyo, both of Japan

[73] Assignee: Kabushiki Kaisha Toshiba, Kawasaki, Japan

[21] Appl. No.: 652,785

[22] Filed: Feb. 7, 1991

[30] Foreign Application Priority Data

Feb. 7, 1990 [JP] Japan .................................. 2-28014

[51] Int. Cl.⁵ .................... H01L 21/265; H01L 29/70
[52] U.S. Cl. ...................................... 437/31; 437/154; 437/940; 148/DIG. 78
[58] Field of Search .................. 437/154, 940, 31; 148/DIG. 78

[56] References Cited

U.S. PATENT DOCUMENTS

| 3,418,186 | 12/1968 | Ku | 148/DIG. 78 |
| 4,495,512 | 1/1985 | Isaac et al. | 437/31 |
| 4,581,319 | 4/1986 | Wieder et al. | 437/31 |

FOREIGN PATENT DOCUMENTS 1281766  11/1989  Japan .................................. 437/31

Primary Examiner—O. Chaudhuri
Assistant Examiner—Long Pham
Attorney, Agent, or Firm—Foley & Lardner

[57] ABSTRACT

To manufacture a semiconductor device, a buried layer, epitaxial layer and an element separating layer are formed on a substrate, in order; a first resist film is formed thereon and an opening at which a first base is to be formed in patterned in the epitaxial layer; a first base is formed by ion-injection with the first resist film as a mask; the first resist film is removed and an interlayer insulating film is formed; a second resist film is formed thereon and an opening at which a second base is to be formed is removed by etching; the bottom surface of the opening portion is oxidized to form a second base under the same opening due to reduction of impurity concentration; the oxide film is removed and a polysilicon film is formed; an emitter electrode is patterned; and an emitter layer is formed on the second base by ion injection and thermal diffusion. Since the first and second base can be formed in self-alignment condition, the element can be minimized without providing a mask matching margin. Further, when a second interlayer insulating film is formed between the first base and the emitter layer as a sidewall spacer, the distance between the two can be precisely controlled by changing the film thickness of the second interlayer film, thus realizing a microstructure semiconductor device.

2 Claims, 3 Drawing Sheets

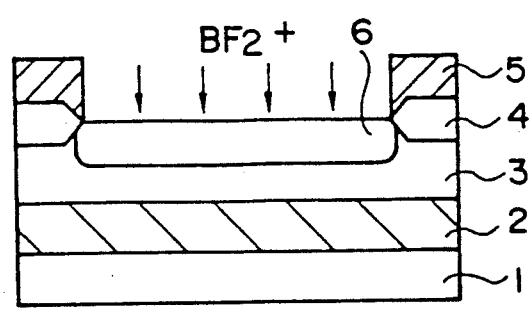
FIG. IA
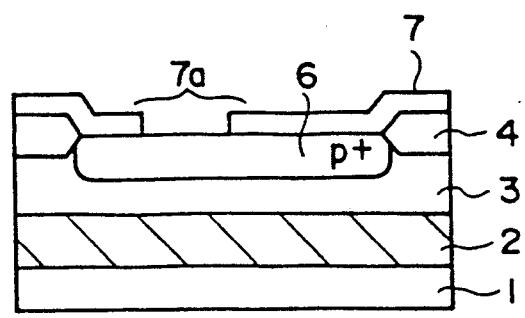
FIG. IB
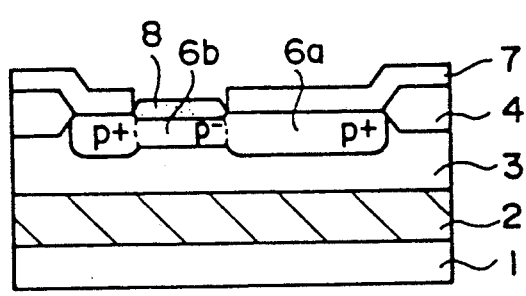
FIG. IC
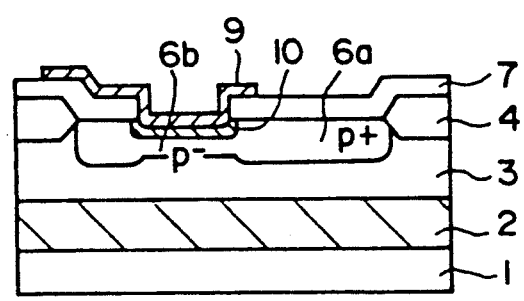
FIG. ID

METHOD OF MANUFACTURING BIPOLAR TRANSISTOR WITH SELF-ALIGNED BASE REGIONS

BACKGROUND OF THE INVENTION

The present invention relates to a method of manufacturing a semiconductor device, and, in particular, a method suitable for manufacturing a microstructure bipolar CMOS (Bi CMOS) device.

With the higher integration of semiconductor devices, microstructure are required more and more for each element. An example of semiconductor devices for which a microstructure is required is a Bi CMOS device, in which bipolar transistors and CMOS transistors are arranged on the same substrate, in particular. The conventional method of manufacturing bipolar transistors in a Bi CMOS device will be described below.

FIGS. 3A to 3C show a conventional manufacturing method. First, as shown in FIG. 3A, a buried layer 32 is formed on the surface of a semiconductor substrate 31 by diffusing antimony (Sb). Further, an epitaxial layer 33 is formed on the surface of the buried layer 32 by the silicon epitaxial growth technique. Thereafter, an element separating layer 34 is formed between elements to be formed. A resist is applied on the surface of the element separating layer 34 to form a resist film 35; the obtained resist film 35 is patterned; and a base p+ region 36 is formed by injecting ions of boron fluoride ($BF_2^+$) with the resist film 35 as a mask. This base p+ region 36 is formed to reduce the base resistance.

Thereafter, as shown in FIG. 3B, after the resist film 35 has been removed, a new resist is applied; the obtained resist film is patterned to form a resist film 35a, in which a portion for forming a base p− region is removed; and the base p− region 37 is formed by injecting boron ions (B+), with the resist film 35a as a mask.

Further, as shown in FIG. 3C, the resist film 35a is removed to form an interlayer insulating film 38. After the interlayer insulating film 38 has been patterned by the isotropic reactive ion etching technique, an emitter polysilicon electrode 39 is formed. Further, an emitter layer 40 can be formed by injecting impurity ions such as arsenic (As) into the emitter polysilicon electrode 39 and diffusing the injected impurity ions into the base p− region 37 by heat treatment. NPN type bipolar transistors are conventionally manufactured in accordance with the above-mentioned method.

In the conventional method, however, since the base p+ region 36 is formed by patterning the resist film 35, there inevitably exists an offset in the mask matching process. Therefore, a mask matching margin is required between the base p+ region 36 and the emitter layer 40 under consideration of the inevitable mask matching error. As a result, a relatively large distance of about 2 μm, for instance, is necessary between the base p+ 36 region and the emitter layer 40, thus, resulting in difficulty in realigning a microstructure element.

SUMMARY OF THE INVENTION

The object of the present invention is to provide a method of manufacturing a semiconductor device as a microstructure.

To achieve the above-mentioned object, the first aspect of the present invention provides a method of manufacturing a semiconductor device, comprising the steps of:

(a) forming a buried layer, an epitaxial layer, and an element separating layer in that order on a semiconductor substrate;

(b) forming a first resist film having an opening portion at which a first base is to be formed, in the epitaxial layer;

(c) forming the first base by injecting impurity ions into the epitaxial layer by use of the first resist film as a mask;

(d) removing the first resist film and forming an interlayer insulating film thereon;

(e) forming a second resist film having an opening portion at which a second base lower in impurity concentration than the first base is to be formed, on the surface of the interlayer insulating film, and forming the opening portion in the interlayer insulating film by use of second resist film as a mask;

(f) removing the second resist film, and forming an oxide film under the opening portion and in the first base by oxidation treatment, to form the second base under the same opening portion due to reduction of impurity concentration;

(g) removing the oxide film and forming a polysilicon film, and forming an emitter electrode by patterning; and (h) forming an emitter layer on the surface of the second base by injecting impurity ions into the emitter electrode and diffusing the injecting impurity ions by heat treatment.

Further, the second aspect of the present invention provides a method of manufacturing a semiconductor device, comprising the steps of:

(a) forming a buried layer, an epitaxial layer, and an element separating layer in order on a semiconductor substrate;

(b) forming a first resist film having an opening portion at which a first base is to be formed, in the epitaxial layer;

(c) forming the first base by injecting impurity ions into the epitaxial layer by use of the first resist film as a mask;

(d) removing the first resist film and forming a first interlayer insulating film thereon;

(e) forming a polysilicon film on the surface of the first interlayer insulating film;

(f) forming a second resist film having an opening portion at which a second base lower in impurity concentration than the first base, or the surface of the polysilicon film and forming the opening portion in the interlayer insulating film and the polysilicon film by use of the second resist film as a mask;

(g) removing the second resist film, and forming an oxide film under the opening portion and in the first base by oxidation treatment, to form the second base under the same opening portion due to reduction of the impurity concentration;

(h) forming a second interlayer insulating film on the surface thereof;

(i) forming a sidewall on a side surface of the opening portion of isotropic-etching the second interlayer insulating film;

(j) forming a polysilicon film on the surface thereof and forming an emitter electrode by patterning; and (k) forming an emitter layer on the surface of the second base by injecting impurity ions into the emitter electrode and diffusing the injected impurity ions by heat treatment.

According to the present invention, since an oxide film is formed by oxidation treatment at the opening first base, and further the second base of lower impurity concentration can be formed due to transfer of impurity atoms under the oxide film, it is possible to form the first and second bases of different impurity concentrations in self-alignment condition. Accordingly, since no mask matching margin is necessary, it is possible to produce microstructure elements.

Further, when a sidewall is formed in an area at which the second base is to be formed by isotropic etching of the second interlayer insulating film, since a spacer is provided between the first base and the emitter layer, it is possible to control the distance between the first base and the emitter layer in high precision by changing this spacer thickness, that is, the film thickness of the second interlayer insulating film, thus realizing microstructure elements and accurate control of the element breakdown voltage.

BRIEF DESCRIPTION OF THE DRAWINGS

In the attached drawings;

FIGS. 1A to 1D are cross-sectional views showing elements in the order of the manufacturing process for assistance in explaining the first embodiment of the method of manufacturing a semiconductor device according to the present invention;

DESCRIPTION OF THE PREFERRED EMBODIMENTS

Figure 2A:
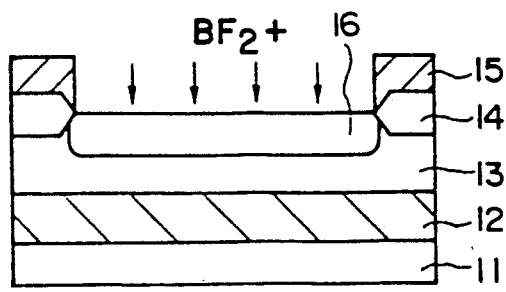
FIGS. 2A to 2E are similar cross-sectional views showing elements in the order of the manufacturing process, for describing the second method according to the present invention.

A first embodiment of the present invention will be described with reference to the attached drawings. FIGS. 1A to 1D show the manufacturing method in the order of the process.

In the same way as in the conventional method, a buried layer 2 is formed on the surface of a semiconductor substrate 1 by diffusing antimony (Sb). An epitaxial layer 3 is formed on the surface of the buried layer 2 by silicon epitaxial growth technique, and further an element separating layer 4 is formed between elements to be formed. A resist film 5 is formed on the surface of the element separating layer 4, and the resist film 5 is patterned so that an area at which a base p+ layer is to be formed is removed. By use of the formed resist film 5 as a mask, a base p+ region 6 is formed by injecting ions of boron fluoride ($BF_2^+$) at an acceleration voltage of 50 keV and a dose of $5 \times 10^{15}$ m$^{-2}$ for instance, as shown in FIG. 1(A).

Thereafter, as shown in FIG. 1(B), the resist film 5 is removed, and an interlayer insulating film 7 of silicon oxide film with a thickness of 2000 Å, for instance, is formed on the surface thereof. An area at which an emitter layer is to be formed (i.e., an opening portion 7a) is formed in the interlayer insulating film 7 by reactive ion etching technique.

Then, the bottom surface of the opening portion 7a is oxidized by the heat treatment of a wet oxidization at 850° C., for instance, to form an oxide film 8, as shown in FIG. 1C. Since the impurity atoms within the base p+ region 6 and only under the oxide film 8 transfer into the oxide film 8, the impurity concentration in the base p+ region 6 and under the oxide film 8 is reduced, so that a base p− region 6b can be formed in the base p+ region 6. As a result, it is possible to form both the base p+ (6a) and p− (6b) regions in self-alignment condition with respect to each other.

Thereafter, the oxide film 8 is removed by wet etching, and an emitter polysilicon electrode 9 with a film thickness of 2000 Å, for instance is formed on the surface thereof. Further, an emitter layer 10 is formed under the electrode 9 by injecting ions of arsenic (As), for instance, at an acceleration voltage of 50 keV and a dose of $1 \times 10^{16}$ cm$^{-2}$, as shown in FIG. 1D. As described above, and an NpN bipolar transistor can be manufactured. In the method according to the present invention, since the emitter layer 10 and the base p− (6b) and p+ (6a) regions are formed in self-alignment with respect to each other, it is possible to manufacture a microstructure bipolar transistor, without providing mask matching margin being required in the convention method.

A second embodiment of the present invention will be described hereinbelow with reference to FIGS. 2A to 2E. In the same way as in the first embodiment, a buried layer 12, an epitaxial layer 13, and an element separating layer 14 are formed in order on a semiconductor substrate 11, as shown in FIG. 2A. Further, a resist film 15 is formed on the surface of the element separating layer 14, and the formed resist film 15 is patterned so that only the area at which a base p+ layer is to be formed is removed. By use of the formed resist film 15 as a mask, a base p+ region 16 is formed by injecting ions of boron fluoride ($BF_2^+$) at an acceleration voltage of 50 keV and a dose of $5 \times 10^{15}$ m$^{-2}$, for instance.

Figure 2B:
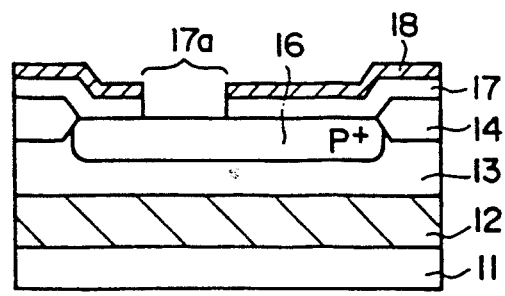

As shown in FIG. 2B, the resist film 15 is removed, and an interlayer insulating film 17 of silicon oxide film with a thickness of 2000 Å, for instance is formed on the surface thereof by low-voltage CVD (chemical vapor deposition) technique. Further, a polysilicon film 18 with a thickness of 1000 Å, for instance is formed on the surface thereof by low-voltage CVD technique.

A resist is applied on the surface of the formed polysilicon film 18 and an area at which an emitter layer is to be formed is removed. By use of the obtained resist film (not shown) as a mask, an area at which an emitter layer is to be formed (i.e. an opening portion 17a) is formed in both the interlayer insulating film 17 and the polysilicon film 18 by reactive ion etching technique. Thereafter, the resist film is removed.

Figure 2C:
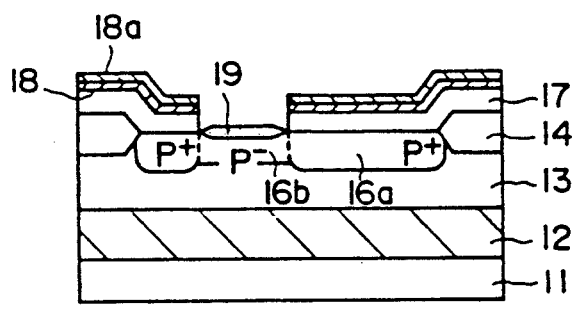

Then, the bottom surface of the opening portion 17a is oxidized by heat treatment of wet oxidization at 850° C., for instance to form an oxide film 19 with a film thickness of about 500 Å, as shown in FIG. 2C. By this thermal oxidization, an oxide film 18a with a film thickness of about 500 Å is formed on the surface of the polysilicon film 18. Since the impurity atoms within the base p+ region 16 and only under the oxide film 19 transfer into the oxide film 19, the impurity concentration within the base p+ region 16 and under the oxide film 19 is reduced, so that a base p− region 16b can be formed in the base p+ region 16. As a result, it is possible to form both the base p+ (16a) and p− (16b) regions in self-alignment condition with respect to each other.

Figure 2D:
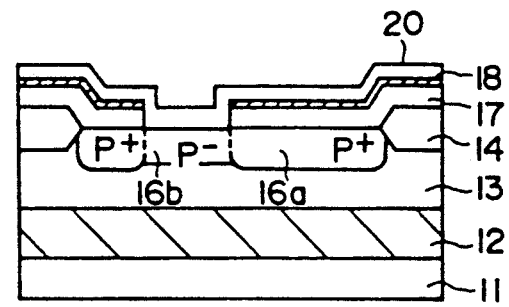

Thereafter, the oxide films 18a and 19 are both removed, and an interlayer insulating film 20 of silicon oxide film with a thickness of 1000 Å, for instance is formed on the entire surface thereof by the CVD method, as shown in FIG. 2D.

Further, a sidewall 20a is formed on the side surface of the opening portion 17a by etch-backing the interlayer insulating film 20 by reactive ion etching technique. In this process, the polysilicon film 18 protects the interlayer insulating film 17 from being removed during the etching process, thus serving to retain the insulating function.

Figure 2E:
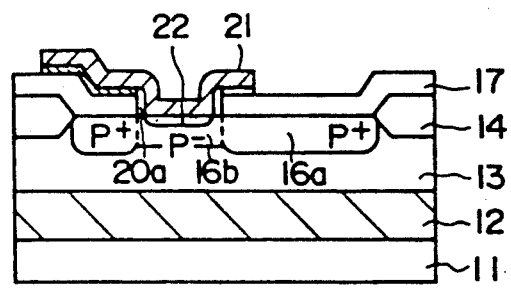
Figure 3A:
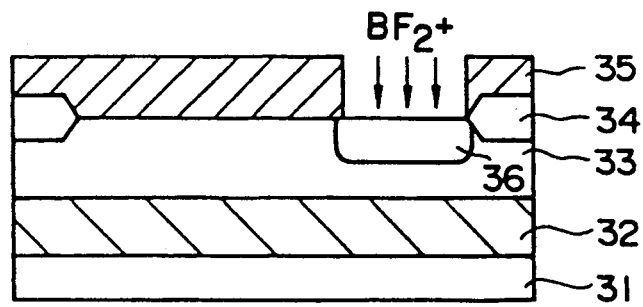
FIGS. 3A to 3C are similar cross-sectional views for describing the conventional method of manufacturing a semiconductor device.
Figure 3B:
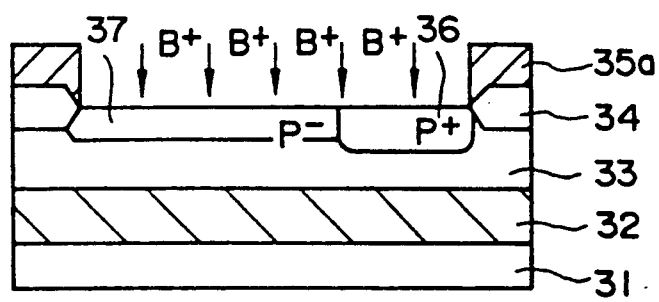
Figure 3C:
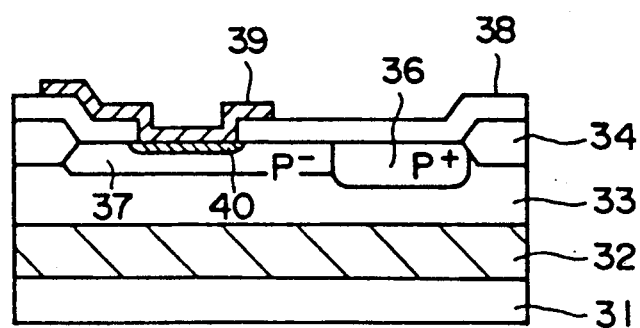

Thereafter, in the same way as with the case by the first embodiment, an emitter polysilicon electrode 21 with a film thickness of 2000 Å, for instance is formed on the surface thereof. Further, an emitter layer 22 is formed under the emitter polysilicon electrode 21 by injecting and diffusing impurity ions of arsenic (As), for instance, at an acceleration voltage of 50 keV and a dose of $1 \times 10^{16}$ cm$^{-2}$, as shown in FIG. 2E. As described above, an NpN bipolar transistor can be manufactured.

According to the second embodiment, since the sidewall 20a can be formed as a spacer between the base p+ region 16a and the emitter layer 22, it is possible to control the distance between the base p+ region 16a and the emitter layer 22 with high precision by changing the film thickness of the interlayer insulating film 20 formed as the sidewall 20a, thus allowing a microstructure bipolar transistor to be manufactured. At the same time, it is also possible to control the breakdown voltage between the base and the emitter by changing the above-mentioned distance.

The above embodiments have been explained only by way of example, and therefore the present invention is not limited to the above embodiments. For example, it is also possible to adopt various different impurity ions as those to be injected in the process shown in FIGS. 1 and 2.

What is claimed is:

1. A method of manufacturing a semiconductor device, comprising the steps of:
   (a) forming a buried layer and an epitaxial layer, in order, on a semiconductor substrate;
   (b) forming an element isolating layer on said epitaxial layer;
   (c) depositing a first resist film having a first opening portion where a first base region is to be formed;
   (d) forming said first base region by injecting impurity ions into the epitaxial layer by sue of said first resist film as a mask;
   (e) removing said first resist film and forming an interlayer insulating film on the surface of said first base region and the element isolation layer;
   (f) forming a second opening in the interlayer insulating film, said second opening being disposed in a region where a second base region is to be formed;
   (g) forming an oxide film on the surface of said first bas region in said second opening by oxidation treatment, to form said second base region in a self-aligned manner, said second base region having lower impurity concentration than said first base region, due to reduction of the impurity concentration by the oxidation treatment;
   (h) removing said oxide film;
   (i) depositing a polysilicon film on the surface of said second base region and patterning said polysilicon film to form an emitter electrode;
   (j) injecting impurity ions into said emitter electrode; and
   (k) forming an emitter layer on the surface of said second base region by diffusing the injected impurity ions by heat treatment.

2. A method of manufacturing a semiconductor device, comprising the steps of:
   (a) forming a buried layer and an epitaxial layer, in order, on a semiconductor substrate;
   (b) forming an element isolating layer on said epitaxial layer;
   (c) depositing a first resist film having a first opening portion where a first base region is to be formed;
   (d) forming said first base region by injecting impurity ions into said epitaxial layer by use of the first resist film as a mask;
   (e) removing said first resist film;
   (f) depositing an interlayer insulating film and a first polysilicon film on the surface of said first base region and the element isolation layer;
   (g) forming a second opening in the interlayer insulating film and the first polysilicon film, said second opening being disposed in a region where a second base region is to be formed;
   (h) forming an oxide film on the surface of said first base region in shad second opening by oxidation treatment, to form said second base region in a self-alignment manner, said second base region having a lower impurity concentration than said first base region due to reduction of the impurity concentration by oxidation;
   (i) removing the oxide film;
   (j) depositing a second interlayer insulating film on the whole surface;
   (k) performing anisotropic etching on said second interlayer insulating film, to remain a sidewall on a side surface of said second opening portion;
   (l) depositing a second polysilicon film over the whole surface and patterning it to form an emitter electrode;
   (m) injecting impurity ions into said emitter electrode; and
   (n) forming an emitter layer on the surface of said second base region by diffusing the injected impurity ions by a heat treatment.

* * * * *